United States Patent [19]

Hsiang

[11] Patent Number: 5,214,569
[45] Date of Patent: May 25, 1993

[54] MOTHER BOARD STRUCTURE WITH FITTING HOLES

[76] Inventor: Lin C. Hsiang, 5F-23, 70, Fu-Shing Road, Taoyuan, Taiwan

[21] Appl. No.: 755,850

[22] Filed: Sep. 6, 1991

[51] Int. Cl.$^5$ .............................................. H05K 1/00
[52] U.S. Cl. .................................. 361/397; 174/138 E; 174/158 R; 174/166 S; 361/412; 361/413
[58] Field of Search ............ 174/138 E, 138 G, 158 R, 174/166 S; 361/380, 391, 392, 393, 396, 397, 399, 412, 413, 415, 417, 419, 420, 427, 429; 439/44, 69, 74, 76; 248/216.4, 219.1, 221.3

[56] References Cited

U.S. PATENT DOCUMENTS 4,901,205 2/1990 Landis et al. ....................... 361/413

Primary Examiner—Leo P. Picard
Assistant Examiner—D. Sparks
Attorney, Agent, or Firm—Bacon & Thomas

[57] ABSTRACT

A mother board for a computer provided with a plurality of keyhole shaped fitting holes with protective elements extending around and downwardly from the peripheral edges of the large elliptical portions for preventing the annular slots of posts used in securing a PC board to the mother board from seizing the edges of the large elliptical portions during removal of the PC board. An interface rack is integrally formed with the mother board and provided with a plurality of main slots for receiving interfaces therein, each main slot terminating in an insertion slot formed between a positioning plate and the bottom of the interface rack for guiding and securing the interface to the rack.

1 Claim, 3 Drawing Sheets

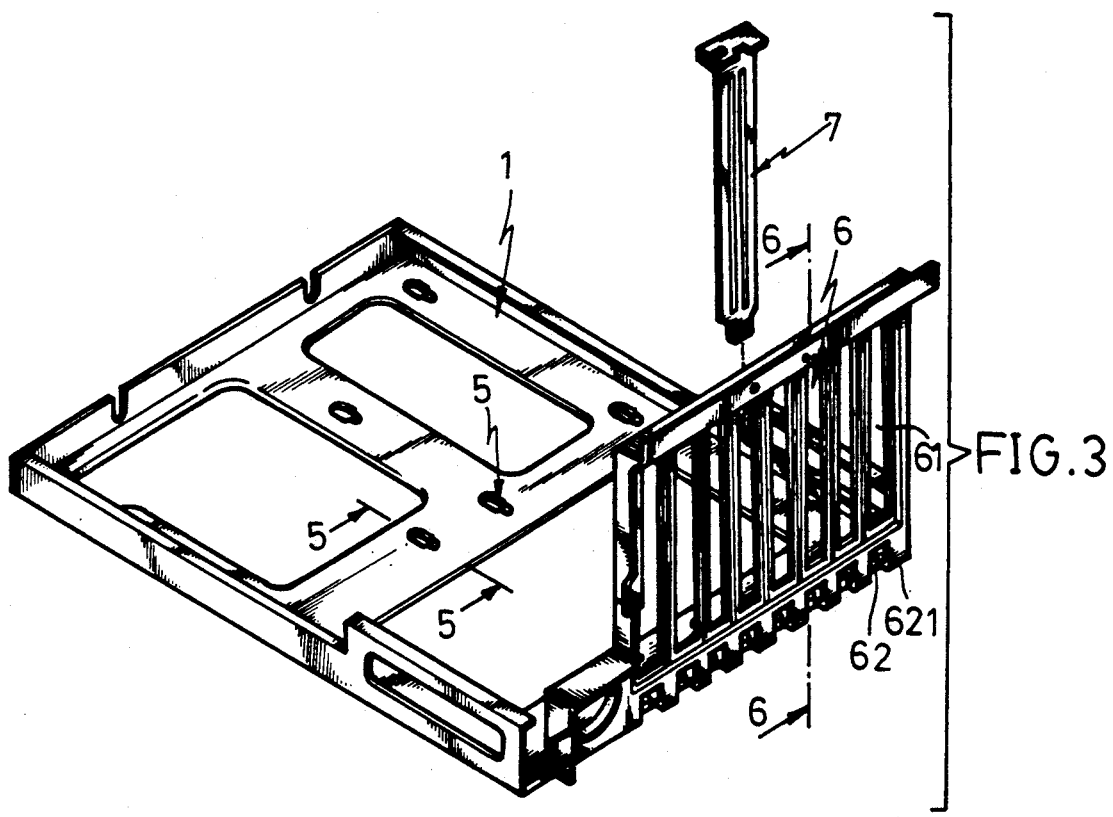

MOTHER BOARD STRUCTURE WITH FITTING HOLES

BACKGROUND OF THE INVENTION

The present invention relates to an improved mother board structure having fitting holes and an interface rack and particularly fitting holes for the fitting and removal of posts for installation of a PC board, and an interface rack for insertion of interfaces in a computer.

Generally, as shown in FIGS. 1 and 2, a mother board (2) for a computer has to be incorporated with a number of posts (3) for installation of a PC board (4). For such installation, the upper end of each post is fixed to a corresponding hole in the PC board (4), and an annular slot formed at the lower end of the post is placed in a large elliptical portion (211) of the corresponding fitting hole at the mother board (2) and then moved transversely for retaining by a small elliptical portion (212) in order to fix the PC board (4) in place. However, upon removal of the PC board, a slight deviation in direction of movement will cause the slot (31) of the post to be seized by the peripheral edge of the large elliptical portion (211) of the fitting hole, and make removal of the PC board difficult. Moreover, an interface rack is normally provided at the back of the motor board for installation of interfaces, and generally a cavity is formed at the bottom of the interface rack for receiving a projected portion of a plate connected to the interface and then the plate is secured to the rack by a bolt at the top of the interface rack. Such a design cannot assure close insertion of the interface, and the interface may become loosened.

In view of the above defects, the inventor has created an improved mother board structure to eliminate the above defects.

SUMMARY OF THE INVENTION

The present invention provides an improved structure for a mother board, particularly a structure to facilitate removal of posts for a PC board and installation of interfaces. It includes a plurality of fitting holes at the mother board, each hole having a protecting element extending downwardly from a large elliptical portion of the fitting hole to prevent the posts for installation of a PC board on the mother board from seizing on the mother board when the PC board is being removed, and an interface rack having a positioning plate extending perpendicularly from the bottom of each slot and having a guide element to guide an interface during insertion into an insertion slot. Moreover, the flexibility of the positioning plate can firmly secure the interface to the interface rack, and the interface rack is integrally formed with the mother board to assure accurate fitting and to provide additional strength.

BRIEF DESCRIPTION OF THE DRAWINGS

FIG. 3 is a perspective view of a mother board according to an embodiment of the present invention.

DETAILED DESCRIPTION OF THE PREFERRED EMBODIMENT

Figure 1:
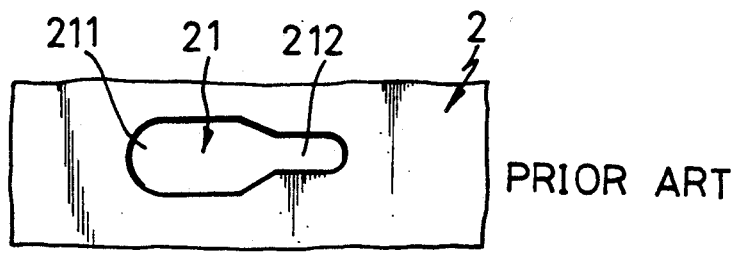
FIG. 1 illustrates a conventional fitting hole in a mother board.
Figure 2:
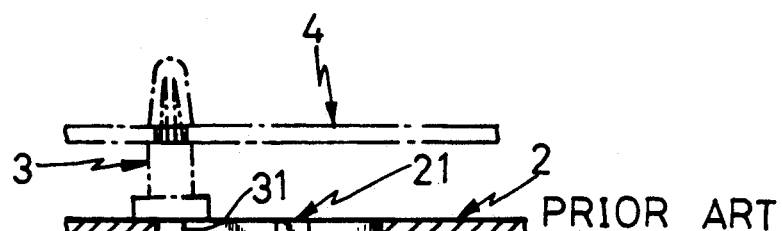
FIG. 2 illustrates the assembly of a PC board to the mother board with the conventional fitting hole.
Figure 4:
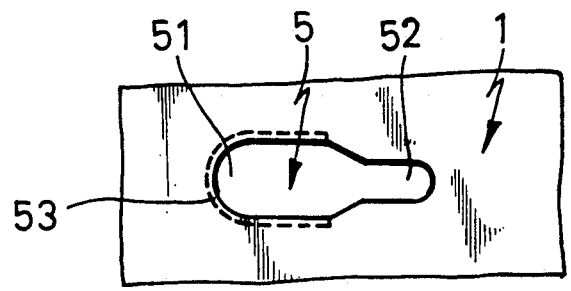
FIG. 4 illustrates a fitting hole in a mother board according to the present invention.
Figure 5:
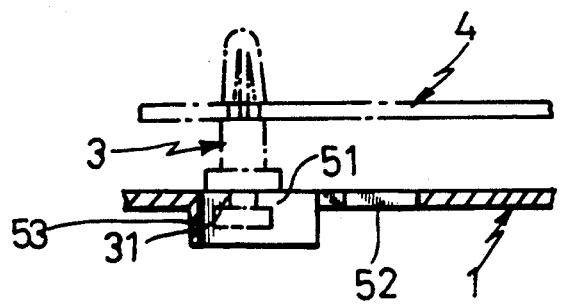
FIG. 5 is a cross-sectional view taken along the line 5—5 in FIG. 3.

As shown in FIGS. 3, 4 and 5, the present invention includes a plurality of fitting holes (5) in a mother board (1). Each fitting hole (5) is designed in a substantially keyhole shape defined by a large substantially elliptical portion (51) at one side which reduces gradually to form a small substantially elliptical portion (52) at another side. There is a protective element (53) extending around and downwardly from the circumference or peripheral edge of the large elliptical portion (51) so that the edge of large elliptical portion (51) will not be seized by an annular slot (31) of the post (3).

Figure 6:
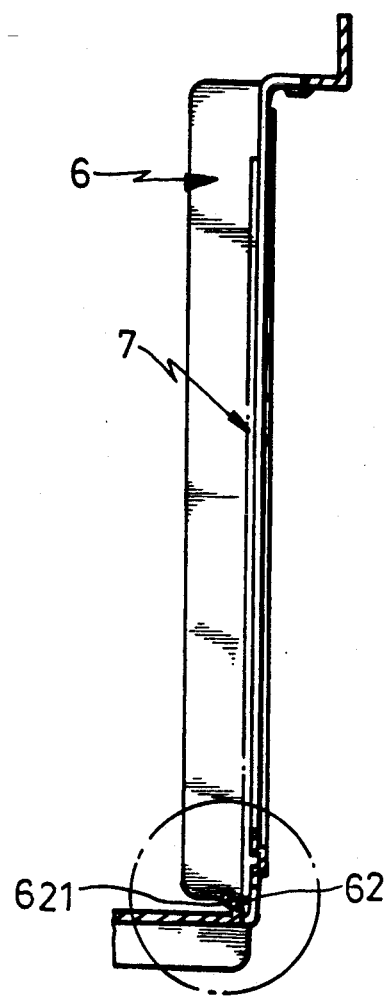
FIG. 6 is a cross-sectional view taken along the line 6—6 in FIG. 6.
Figure 7:
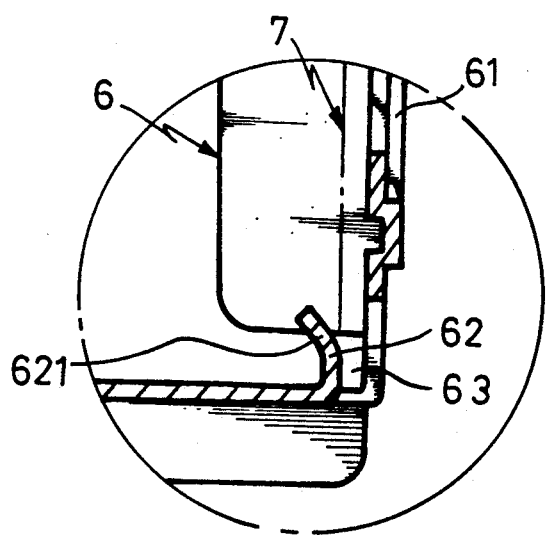
FIG. 7 illustrates a partial enlarged view of the interface rack according to the present invention.

As shown in FIGS. 3, 6 and 7, an interface rack (6), which is integrally formed with mother board (1), comprises a plurality of main slots (61), each main slot (61) is incorporated with a positioning plate (62) extending perpendicularly and inwardly from its bottom. The upper end of each positioning plate (62) is bent inwardly to form a guide element (621). An insertion slot (63) is thus formed between the positioning plate (62) and the bottom of the interface rack (6).

With reference to the above structure, the features of the present invention are described below:

As shown in FIGS. 4 and 5, because there is a protective element (53) around the circumference or peripheral edge of the large elliptical portion (51) of each fitting hole (5) at the mother board, a PC board (4) fixed to the mother board (1) by the post (3) can be easily removed because the annular slot (31) of the post (3) is prevented from seizing the peripheral edge of portion (51)—a main feature of the present invention. Please refer to FIGS. 3, 6 and 7 for another feature of the present invention. With the positioning plate (62) at the bottom of the interface rack (6), the interface can be smoothly inserted into the insertion slot (63) through guidance of the guide element (621) and then secured by the positioning plate (62) which firmly closes the main slot (61) of the interface rack (6). As shown in FIG. 3, the interface rack (6) is integrally formed with the mother board (1) to provide additional strength, save production cost and time, and provide an accurate fitting which eliminates the requirement in assembling the interface rack to the mother board as normally practiced in the prior art.

Characteristics and merits of the present inventions are summarized as follows:

(1) The fitting holes in the mother board are designed with protective elements to prevent the posts for installation of PC board from being seized by the fitting holes upon removal of the PC board, and hence facilitate removal of the PC board.

(2) The interface rack is designed with positioning plates having guide elements to guide insertion of interfaces, and the flexibility of such positioning plates can secure the respective interfaces to the interface rack tightly without seams or looseness.

(3) The present invention permits easy installation and removal of a PC board and interfaces to save labor and time.

(4) The present invention has a simple structure and is an improvement of the prior art.

I claim:

1. A mother board for a computer of the type having at least one fitting hole formed therein for engagement by the annular slot of at least one post used to detachably secure a PC board to the mother board, with the slot being of a substantially key hole configuration defined by a large elliptical portion and a small elliptical portion, the improvement comprising the large elliptical portion including a protective element extending around and downwardly from the peripheral edge thereof for preventing the annular slot of the post from seizing the peripheral edge during removal of the PC board.

* * * * *